United States Patent
Hug et al.

(10) Patent No.: US 9,571,943 B2
(45) Date of Patent: Feb. 14, 2017

(54) HEARING DEVICE WITH A TRANSDUCER MODULE AND METHOD FOR MANUFACTURING A TRANSDUCER MODULE

(75) Inventors: Roland Hug, Hinwil (CH); Jonas Meyer, Stäfa (CH); Sébastien Aubert, Zürich (CH); Daniel Baer, Winterthur (CH); Jan Angst, Hirzel (CH); Erdal Karamuk, Männedorf (CH); Hilmar Meier, Zürich (CH); Andi Vonlanthen, Oberrohrdorf (CH)

(73) Assignee: SONOVA AG, Staefa (CH)

( * ) Notice: Subject to any disclaimer, the term of this patent is extended or adjusted under 35 U.S.C. 154(b) by 255 days.

(21) Appl. No.: 13/981,410

(22) PCT Filed: Jan. 18, 2012

(86) PCT No.: PCT/EP2012/050685
§ 371 (c)(1),
(2), (4) Date: Feb. 6, 2014

(87) PCT Pub. No.: WO2012/104142
PCT Pub. Date: Aug. 9, 2012

(65) Prior Publication Data
US 2014/0153755 A1    Jun. 5, 2014

(30) Foreign Application Priority Data
Feb. 1, 2011 (WO) ............... PCT/EP2011/051380

(51) Int. Cl.
*H04R 25/00* (2006.01)
*G06F 17/50* (2006.01)
*H04R 7/18* (2006.01)

(52) U.S. Cl.
CPC ............. *H04R 25/554* (2013.01); *G06F 17/50* (2013.01); *H04R 25/604* (2013.01); *H04R 25/65* (2013.01);
(Continued)

(58) Field of Classification Search
CPC . H04R 2225/77; H04R 2225/49; H04R 25/70; H04R 25/65; H04R 25/658; H04R 25/604; H04R 25/554; G06F 17/50
(Continued)

(56) References Cited

U.S. PATENT DOCUMENTS 5,960,093 A    9/1999  Miller
5,987,146 A   11/1999  Pluvinage et al.
(Continued)

FOREIGN PATENT DOCUMENTS

EP    0 548 580 A1    6/1993
EP    0 851 710 A1    7/1998
(Continued)

OTHER PUBLICATIONS

Madsen, "Small Balanced Armature Receiver for Electronic Telephone Sets", Journal of the Audio Engineering Society, Auto Engineering Society, New York, NY, US, vol. 19, No. 3, Mar. 1, 1971.
(Continued)

*Primary Examiner* — Sunita Joshi
(74) *Attorney, Agent, or Firm* — Pearne & Gordon LLP

(57) ABSTRACT

The present invention proposes a hearing device with a housing and a receiver module which comprises a shell (16) with a cavity having an opening (17), wherein at least part of the shell (16) forms part of the housing, and wherein an electro-acoustic transducer, comprising a motor assembly (2) and an acoustic assembly (3) including a membrane, is arranged within the cavity, the acoustic assembly (3) being disposed within the shell (16) such that the cavity is divided into a front chamber (12) and a back chamber (13), the motor assembly (2) being disposed within the back chamber (13) or the front chamber (12) and being operatively coupled to the membrane, and the front chamber (12) being in acoustic communication with the exterior of the shell (16) via the opening (17), wherein the shell (16) has an outer surface
(Continued)

individually shaped according to a measured inner shape of a section of an ear canal of a user of the hearing device. Furthermore, a method for manufacturing such a receiver module is presented.

22 Claims, 4 Drawing Sheets

(52) U.S. Cl.
CPC ............... *H04R 25/658* (2013.01); *H04R 7/18* (2013.01); *H04R 25/70* (2013.01); *H04R 2225/49* (2013.01); *H04R 2225/77* (2013.01)

(58) Field of Classification Search
USPC ................................ 381/315, 324, 60; 703/1
See application file for complete search history.

(56) References Cited

U.S. PATENT DOCUMENTS

| | | | |
|---|---|---|---|
| 6,920,414 B2* | 7/2005 | Tøpholm | ........................... 703/1 |
| 6,937,738 B2 | 8/2005 | Armstrong et al. | |
| 7,822,218 B2* | 10/2010 | Van Halteren | ......... H04R 9/063 |
| | | | 381/312 |
| 2005/0058313 A1 | 3/2005 | Victorian et al. | |
| 2006/0153418 A1 | 7/2006 | Halteren | |
| 2006/0233384 A1* | 10/2006 | Bachler et al. | .................. 381/60 |
| 2007/0147642 A1 | 6/2007 | Kasanmascheff | |
| 2008/0031481 A1* | 2/2008 | Warren et al. | ................. 381/322 |
| 2008/0181440 A1 | 7/2008 | Saltykov | |
| 2009/0220113 A1* | 9/2009 | Tiscareno | ..................... 381/309 |

FOREIGN PATENT DOCUMENTS

| | | |
|---|---|---|
| EP | 1 209 948 A2 | 5/2002 |
| EP | 1 246 506 A1 | 10/2002 |
| EP | 1 640 972 A1 | 3/2006 |
| WO | 00/27166 A2 | 5/2000 |
| WO | 02/17838 A1 | 3/2002 |
| WO | 2007/140403 A2 | 12/2007 |

OTHER PUBLICATIONS

International Search Report for PCT/EP2012/050685 dated Mar. 23, 2012.
Written Opinion for PCT/EP2012/050685 dated Mar. 23, 2012.

* cited by examiner

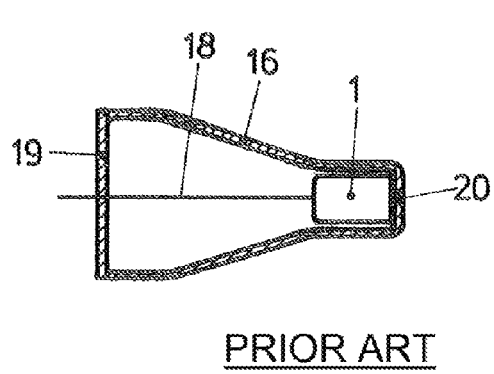
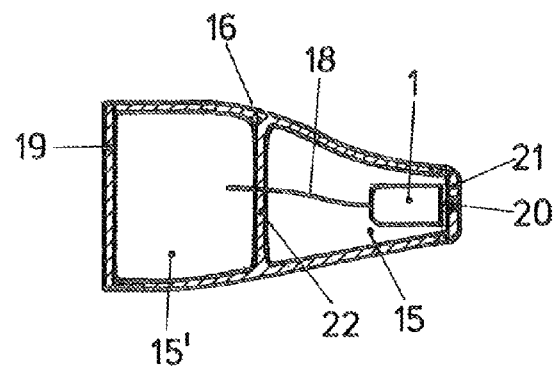
FIG.5a PRIOR ART
FIG.5b
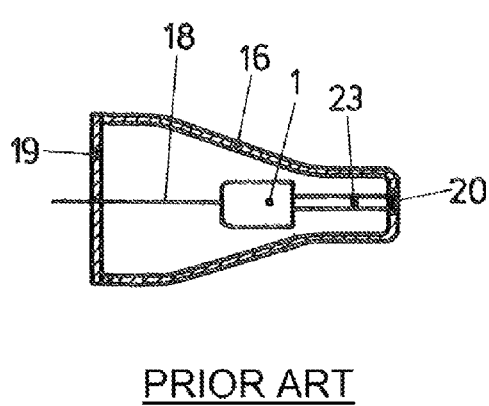
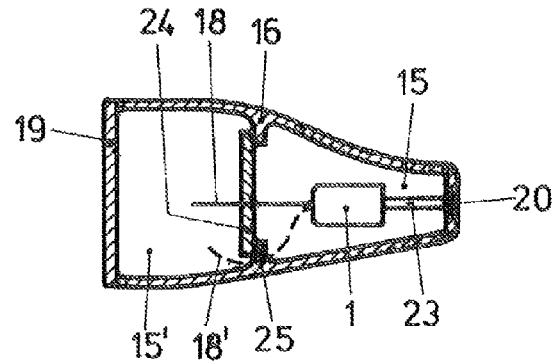
FIG.6a PRIOR ART
FIG.6b

HEARING DEVICE WITH A TRANSDUCER MODULE AND METHOD FOR MANUFACTURING A TRANSDUCER MODULE

TECHNICAL FIELD

The present invention is related to the technical field of hearing devices employing miniature sound transducers, such as a miniature loud speaker, which is often also referred to as a receiver. The present invention especially pertains to a transducer module of a hearing device as well as to a method for manufacturing such a transducer module.

BACKGROUND OF THE INVENTION

Small electronic hearing devices for being worn at an ear or within an ear canal of a user are becoming increasingly popular. Examples of such devices are earphones, for instance used in conjunction with personal audio/video players, gaming units and mobile phones, ear-level communication devices, active hearing protection devices, in-ear monitors as well as hearing aids, sometimes also referred to as hearing instruments or hearing prostheses. Such devices are available in a number of different form factors depending on how they are worn, for instance as behind-the-ear (BTE), in the crest of the cymba, in-the-ear (ITE), in-the-canal (ITC), completely-in-canal (CIC) or hybrid BTE/ITE devices. In many applications it is preferred that the device is as inconspicuous as possible, e.g. for reasons of aesthetics and wearing comfort. This is frequently achieved by placing the device into the ear canal of the user, either partly or fully. Alternatively, the devices are designed to be small enough to fit into the crest of the cymba or to be worn entirely behind the pinna.

In order to provide an audio signal to the ear drum of the user all the mentioned devices require a receiver, i.e. a unit that converts an electrical signal conveying the audio signal into acoustic energy in the form of sound waves (more generally referred to as an electro-acoustic transducer). Such receivers need to be very small, especially in order to fit into the ear canal of a person. Smaller receivers allow to design hearing devices which can be inserted deeper into the ear canal, e.g. into the bony portion, which provides the benefit of reduced occlusion effect. This particularly enables the design of deep-fitted CIC devices. Moreover, smaller receivers allow to design hearing devices that occlude the ear canal to a lesser extent, i.e. that leave the ear canal more open when the hearing device is inserted, providing the benefit of increased wearing comfort as well as a more natural sound perception. Especially open-fitted hybrid BTE/ITE devices, popularly referred to as receiver-in-canal (RIC) or receiver-in-the-ear (RITE) devices, benefit from such small receivers. Furthermore, also BTE devices and devices worn in the crest of the cymba profit from small receivers since it is mainly the size of the receiver that determines the degree of miniaturisation achievable for these devices.

An example of such a miniature receiver is disclosed in EP 0 851 710 A1. Such receivers typically have the shape of a rectangular cuboid, which is especially not optimal in view of the oval-shaped cross-section of the ear canal. Alternatively shaped receivers are shown in EP 1 209 948 A2. A receiver with reduced thickness is described in U.S. Pat. No. 5,960,093. In all of these publications the acoustic membrane, also called diaphragm, is arranged longitudinally within the receiver casing in order to maximise the size of the diaphragm and thus to achieve a high output sound pressure level. Contrary to this EP 0 548 580 A1 proposes a cylindrical receiver for in-the-ear applications where the diaphragm is arranged laterally with respect to the cylinder axis at an open end of the cylinder. However, this design constrains the size of the diaphragm to that of the ear canal cross-section which has the disadvantage of limiting the achievable output sound pressure level relative to the designs mentioned previously.

In addition, it can be beneficial to provide a microphone (i.e. an acousto-electric transducer) in the mentioned devices capable of picking up the sound present in an ear canal of the user of the hearing device. Such a microphone is referred to as an "ear canal microphone" in order to distinguish it from the one or more microphones used to pick up the sound from the surroundings of the hearing device user and therefore referred to as "ambient microphones". Such ear canal microphones can be utilized for a number of purposes. For instance WO 02/17838 A1 discloses a hearing protection device comprising means for verifying proper functioning of the device in terms of sound attenuation, i.e. of sufficient acoustical sealing. The means include an ear canal microphone for measuring the sound present in the ear canal. Furthermore, EP 1640972 A1 proposes a system and method for separation of a user's voice from ambient sound. The system comprises a device to be worn at least partly in the user's ear canal with a first microphone oriented outwardly towards the environment and a second microphone oriented inwardly towards the user's ear canal. An audio signal processing unit processes the audio signals from the first and second microphone using a blind source separation algorithm adapted to separate the user's voice from ambient sound. Furthermore, US 2005/0058313 A1 provides an ear-level communication system comprising an ear mould housing a microphone for use in an ear canal, a processor, and a wireless transmitter. The microphone picks up the user's voice from within the ear canal which is then processed by the processor and transmitted to a remote receiver by means of the wireless transmitter. Furthermore, U.S. Pat. No. 5,987,146 describes an open ear canal hearing aid system which comprises a plurality of ear canal tubes sized for positioning in an ear canal of a user. A receiver and/or microphone are located in the ear canal at the end of ear canal tubes. Furthermore, in U.S. Pat. No. 6,937,738 a digital hearing aid comprising an occlusion subsystem is presented. The occlusion sub-system compensates for the amplification of the digital hearing aid user's own voice within the ear canal. To achieve this, an ear canal microphone captures the sound in the occluded ear canal and provides the signal to circuitry which electronically cancels or minimises its effect. US 2008/0181440 A1 presents a combined receiver and ear canal microphone assembly which for instance can be used in a digital hearing aid according to U.S. Pat. No. 6,937,738. For all these applications it is desirable that the employed ear canal microphones be as small as possible, especially in those instances where both a receiver and an ear canal microphone are to be used, as is the case for active occlusion cancellation mentioned in the last example above.

SUMMARY OF THE INVENTION

The object of the present invention is to provide smaller hearing devices than presently possible. It is a further object of the present invention to propose a transducer module that can be tailored to the specific needs of an individual or to the specific requirements of a hearing device model.

At least these objects are achieved by the hearing device with the transducer module according to claim 1. Various exemplary embodiments thereof as well as a method for manufacturing such a transducer module are given in the further claims. Moreover, a method for fitting the proposed hearing device by applying data as provided by the proposed manufacturing method is given.

The present invention provides a hearing device with a housing and a transducer module, the transducer module comprising a shell with a cavity having an opening, wherein at least part of the shell forms part of the housing, and wherein an electro-acoustic or acousto-electric transducer, comprising a motor assembly and an acoustic assembly including a membrane, is arranged within the cavity, the acoustic assembly being disposed within the shell such that the cavity is divided into a front chamber and a back chamber, the motor assembly being disposed within the back chamber or the front chamber and being operatively coupled (i.e. drivingly connected) to the membrane, and the front chamber being in acoustic communication with the exterior of the shell via the opening, wherein the shell has an outer surface individually shaped according to a measured inner shape of a section of an ear canal of a user of the hearing device.

By directly incorporating the electro-acoustic or acousto-electric transducer into the shell of a transducer module, where at least part of the shell constitutes part of the housing of the hearing device, and thereby replacing the conventionally used receiver or microphone casing with part of the shell a much more flexible design of the transducer module is achievable both in terms of its size and shape as well as in terms of its acoustic properties. By no longer being constrained to the shape and dimensions of the receiver or microphone casing, which is typically a rectangular cuboid, small transducer modules can be designed and hence overall small hearing devices can be realised. Moreover, since a larger degree of design freedom is provided when the electro-acoustic or the acousto-electric transducer is directly arranged within a cavity of the shell instead of within a receiver or microphone casing which has to be disposed in the housing of the hearing device, a larger electro-acoustic or acousto-electric transducer capable of providing a higher maximum output sound pressure level or higher sensitivity, respectively, can often be employed. Furthermore, the acoustic properties of the transducer module can be optimised to meet desired target parameters, such as a certain frequency response, acoustic impedance, resonant frequency, etc. The acoustic properties can be varied by changing the shape and volume of the front and rear chamber, e.g. by altering the size and shape of the cavity as well as the arrangement of the acoustic assembly. These advantages apply to all styles of miniature hearing devices, i.e. to BTE, ITE, CIC and hybrid versions such as RITE hearing devices.

By individually shaping the shell to have an outer surface according to the measured inner shape of a section of the ear canal of the user of the hearing device the specific size and shape of the user's individual ear canal is taken into account, thus allowing to provide a transducer module that can be inserted deeper into the ear canal of the user or alternatively that blocks the ear canal to a lesser extent.

In a further exemplary embodiment of the hearing device a wall of the cavity is shaped substantially according to the measured inner shape of at least part of the section of the user's ear canal. By adapting parts of the cavity to the shape of the user's ear canal the space available within the shell can be optimally utilised.

In a further exemplary embodiment of the hearing device the shell has an outer surface shaped according to data provided defining geometrical constraints regarding size and shape of the shell. In this way the specific size and shape of a class of hearing devices or of a hearing device model intended for instance for a specific group of users or a specific application is taken into account, thus allowing to provide a transducer module that can for example be inserted deeper into the ear canal of the specific group of users or alternatively that blocks the ear canal to a lesser extent for that group of users in the sense of a "one-size-fits/suits-many" solution.

In a further exemplary embodiment of the hearing device the motor assembly and the acoustic assembly are resiliently attached to the shell. By supporting the motor assembly and the acoustic assembly within the shell with elastic, vibration and shock absorbing means, vibrations from the electro-acoustic transducer are not transferred to the shell and conversely shocks impacting on the shell are not transferred to the electro-acoustic or acousto-electric transducer. The former reduces acoustic feedback in configurations where both a receiver and a microphone are located within the shell, as is the case for example in ITE/ITC/CIC-type hearing aids or active hearing protection devices. The latter ensures that the electro-acoustic or acousto-electric transducer is protected against shocks affected on the hearing device from the outside, such as when it is dropped and falls on the ground.

In a further exemplary embodiment of the hearing device the motor assembly and the acoustic assembly are attached to the shell via elastic braces or brackets.

In a further exemplary embodiment of the hearing device the acoustic assembly further comprises a rigid frame to which the membrane is mounted at its periphery. Mounting the membrane in a rigid frame makes it easier to handle during manufacturing of the hearing device. Additionally, this provides a stable structure for attaching the acoustic assembly to the shell. Furthermore, the acoustic properties of the membrane are strongly influenced by the way in which it is held at its periphery, since this affects its oscillation behaviour, hence defining the fixture of the membrane by means of a frame helps to achieve the desired acoustic performance.

In a further exemplary embodiment of the hearing device the membrane is integrally formed with the shell. Such an implementation is attractive when employing an additive manufacturing technology such as 3D printing where the shell is created by laying down successive layers of material. 3D printers allow to print parts and assemblies made of several materials with different mechanical and physical properties in a single build process. Alternative additive manufacturing technologies include selective laser sintering (SLS), fused deposition modelling (FDM), digital light projection (DLP) and stereolithography (SL). Forming the membrane together with the shell in a single manufacturing step saves the step of having to assemble the two and provides a further degree of freedom in customising the transducer module to the requirements of the user by being able to optimise the membrane in terms of its physical dimension, its deployment within the cavity and its acoustic properties.

In a further exemplary embodiment of the hearing device a layer of magnetic shielding material, such as for instance mu-metal, is disposed on the surface of the cavity. By lining the surface of the cavity with a material having a very high magnetic permeability, such as mu-metal, the electro-acoustic or acousto-electric transducer is very effectively shielded against immission of static or low-frequency magnetic fields from the outside which could otherwise be picked up by a coil of the motor assembly and thus influence the acoustic output of the electro-acoustic transducer or the electrical output signal of the acousto-electric transducer. Moreover, by providing such a layer of magnetic shielding material the emission of magnetic fields generated by a coil of the motor assembly can be suppressed in order for instance to avoid inductive coupling of the transducer module with a t-coil (telephone coil) integrated into the hearing device, i.e. to prevent electromagnetic feedback between such components.

In a further exemplary embodiment of the hearing device the transducer module further comprises additional functional units—apart from the electro-acoustic or acousto-electric transducer—, such as for instance one or more ambient microphone modules, an amplifier, a processing unit, a wireless transceiver, an antenna, a t-coil, a power supply, wherein at least one of these additional functional units is disposed within the back chamber. In those cases where the transducer module includes additional functional units, such as for instance a wireless receiver for providing an acoustic signal from a personal audio player to the hearing device, these units can either be disposed in a further cavity within the shell or alternatively, one or more of the units can be disposed in the back chamber of the cavity containing the electro-acoustic transducer. This can for example be the case when the volume of the back cavity needs to be increased, e.g. in order to optimise the low frequency response of the electro-acoustic transducer or to increase the sensitivity of the acousto-electric transducer. To achieve this, the size of the further cavity with the additional functional units and the size of the cavity with the electro-acoustic or acousto-electric transducer are traded-off, so that the back chamber obtains a desired volume and shape. As part of this space optimisation process certain of the further functional units may also have to be shifted from the further cavity to the back chamber. Often, it is desirable to maximise the volume of the back cavity, so that no further cavity is formed but all further functional units are deployed in the back chamber, where the back chamber then essentially consumes the entire volume of the shell together with the front chamber.

In a further exemplary embodiment the hearing device comprises one or more ambient microphone modules each having a microphone membrane, wherein the microphone membrane of at least one of the ambient microphones is substantially perpendicular to the membrane of the acoustic assembly. In devices such as hearing aids, which incorporate both an ambient microphone and a receiver within the same shell, acoustic feedback from the receiver to the ambient microphone is a big problem. This problem arises due to the very close proximity of the ambient microphone and the receiver in such small devices and because the microphone signal is strongly amplified before being applied to the receiver, whereby the high gain supports the build-up of feedback oscillations. In order to minimise the propagation of vibrations from the membrane of the acoustic assembly to the microphone membrane, the microphone should be positioned such that vibrations generated by the membrane of the acoustic assembly (e.g. the receiver) do not influence the microphone output signal, e.g. by arranging the microphone membrane parallel to the direction of the vibrations. In many cases the membrane of the acoustic assembly and the microphone membrane should preferably be arranged perpendicularly to one another. This can be achieved with the transducer module according to the present invention, since the arrangement and orientation of the ambient microphone relative to the membrane of the acoustic assembly is defined during the design and customisation of the transducer module according to the requirements of the hearing device.

In a further exemplary embodiment of the hearing device the back chamber is acoustically sealed from the exterior of the shell. Whilst the front chamber is in acoustic communication with the exterior of the shell via an opening, usually referred to as sound port, e.g. in the form of a spout, the back chamber is substantially sealed from the environment and the front chamber in order to achieve a certain acoustic compliance of the air in the back chamber. This however does not mean that the back chamber is air-tight, since an atmospheric pressure equalisation is necessary, for instance via a perforation in the membrane.

In a further exemplary embodiment of the hearing device the shell is a two-part shell with a first part and a second part. This allows to arrange the motor assembly and the acoustic assembly as well as any further functional units, such as for example a wireless receiver along with an antenna, within the shell during assembly of the hearing device. Following arranging of the various components within the shell, the two parts of the shell are firmly joined together. This can for instance be achieved by gluing or welding the two parts together. Access to the components within the shell can then only be regained by breaking open the shell.

In a further exemplary embodiment of the hearing device the first and the second part are separably connected to one another, for instance by means of quick-connect closures, such as catch pawls, detents or bayonet-type junctions. This allows to access the components within the shell anytime, for instance to replace one or more of them, by simply opening the quick-connect closures and then reclosing them again, e.g. when repair work is completed.

In a further exemplary embodiment of the hearing device the first part of the shell includes the front chamber and the second part of the shell includes the back chamber.

In a further exemplary embodiment of the hearing device the acoustic assembly is mounted between the first part and the second part. This makes the deployment of the acoustic assembly within the shell easy during assembly since the acoustic assembly can simply be placed into the opening of one of the parts before the two parts are joined together. Furthermore, the profile of the openings can be used as supports for the acoustic assembly, thus allowing to position the acoustic assembly quickly and accurately during assembly.

In a further exemplary embodiment of the hearing device the shell further comprises a divider wall which subdivides an interior space of the shell into two cavities, i.e. the cavity and a further cavity.

In a further exemplary embodiment of the hearing device the divider wall is integrally formed with the shell, or alternatively is formed separately from the shell and affixed to the shell. In the latter case a mechanical stop such as a shoulder can be formed as part of the shell and a separate "cap" which acts as the divider wall is then for instance glued onto the mechanical stop thus sealing the cavity and the further cavity from one another. Such sealing is necessary in order to ensure that no air escapes from the cavity which acts as a back chamber of the electro-acoustic or acousto-electric transducer into the further cavity. Poor sealing of the back chamber decreases transducer performance, e.g. in terms of maximum output power or sensitivity.

In a further exemplary embodiment the hearing device further comprises a behind-the-ear component shaped to fit behind an ear of the user, the behind-the-ear component comprising at least one ambient microphone and an amplifier means, wherein the transducer module is separate from the behind-the-ear component, and wherein the amplifier means is operatively connected to the motor assembly. The behind-the-ear component can be a generic part intended for many different users, whereas the transducer module may be custom-made to meet the requirements of an individual user both in terms of its geometrical size and shape as well as in terms of its acoustic properties and performance.

In a further exemplary embodiment of the hearing device one or more micro-bores are provided in a wall of the back chamber for barometric pressure equalisation/compensation, said one or more micro-bores preferably having a low pass characteristic with a cut-off frequency below 10 Hz.

In order to be able to take full advantage of the customisation possibilities of the proposed transducer module especially for tailoring a transducer module to the specific requirements of a certain application or to the specific needs of a group of users or an individual an appropriate method for manufacturing such a customised transducer module is required.

The present invention thus further provides a method for manufacturing a transducer module for being worn at least partly within an ear canal of a user of the transducer module, the transducer module comprising a shell, with a cavity having an opening, and an electro-acoustic or acousto-electric transducer, disposed within the cavity and including a motor assembly and an acoustic assembly, the method comprising the steps of:

providing data defining geometrical constraints regarding size and shape of the shell (this step subsequently being referred to as "the step of providing data");

generating a three-dimensional computer model of the shell taking into account the provided data, such that the shell has an outer surface such that the shell has an outer surface which fulfils the geometrical constraints regarding size and shape of the shell given by the provided data, and of the arrangement of the motor assembly and the acoustic assembly within the cavity, such that the acoustic assembly divides the cavity into a front chamber and a back chamber, whereby the motor assembly is disposed within the back chamber or the front chamber and is operatively coupled (i.e. drivingly connected) to the acoustic assembly, and the front chamber is in acoustic communication with the exterior of the shell via the opening (this step subsequently being referred to as "the step of generating"); and computing acoustic properties of the electro-acoustic or acousto-electric transducer including the front and back chambers based on the generated three-dimensional computer model (this step subsequently being referred to as "the step of computing").

In the step of providing data geometrical constraints are imposed on the size and shape of the shell such that the transducer module can be for instance generally adapted to be worn by a certain group of user, e.g. those with a "small", "medium" or "large" ear canal, thus providing a series of standard, "one-size-fits-many" transducer modules. The step of generating establishes a three-dimensional (3D) computer model of the shell based on the provided geometrical constraints regarding the size and shape of the shell as well as 3D computer models of the components, e.g. the motor assembly and the acoustic assembly to be arranged within the cavity of the shell. The resulting 3D computer model of the shell comprises the cavity and the arrangement of the individual components within the cavity, thus yielding all geometric data necessary for determining the acoustic properties of the electro-acoustic or acousto-electric transducer in the step of computing.

It is to be noted explicitly that the mentioned method of manufacturing a transducer module can be applied to manufacturing transducer modules that are tailored to the specific requirements of a certain hearing device "model". Such a hearing device model can be either a BTE or an ITE hearing device, which is not adapted to a specific individual, e.g. is not shaped according to the individual's ear canal, but is more generically designed to meet the requirements of most user's by providing a hearing device model with a very specific shape and/or size and/or acoustic properties that cannot be achieved with an off-the-shelf receiver or microphone provided for instance in a standard rectangular cuboid shaped casing as a separate unit to be built into a hearing device.

In an exemplary embodiment the manufacturing method further comprises the step of measuring the inner shape of at least a section of the ear canal of the user, wherein the data defining geometrical constraints regarding size and shape of the shell is based on the measured inner shape of the section of the user's ear canal, and (an outer surface of) the shell thus being individually shaped for the specific user (this step subsequently being referred to as "the step of measuring").

The step of measuring provides a 3D computer model of at least part of the user's ear canal, namely of the part of the ear canal where the transducer module is intended to be worn, i.e. where it is to be positioned within the ear canal. The step of generating then establishes a 3D computer model of the shell based on the 3D computer model of at least part of the user's ear canal as well as 3D computer models of the components, e.g. the motor assembly and the acoustic assembly to be arranged within the cavity of the shell.

In a further exemplary embodiment the manufacturing method further comprises the step of modifying the three-dimensional computer model of the shell and/or of the arrangement of the motor assembly and/or the acoustic assembly within the cavity if the computed acoustic properties deviate from desired acoustic properties (this step subsequently being referred to as "the step of modifying"). Hereby, the shape and size of the shell itself as well as the shape, size and location of the cavity within the shell and the arrangement of the components within the cavity can be changed. This yields a modified 3D computer model of the shell including the cavity and the arrangement of the components therein, the modified computer model having modified acoustic properties, which preferably match desired acoustic properties which are based on the individual requirements of the specific user, e.g. in terms of acoustic performance and wearing comfort.

In a further exemplary embodiment of the manufacturing method the step of modifying and the step of computing are repeated until the computed acoustic properties (i.e. those determined in the step of computing) match the desired acoustic properties. Thus the desired acoustic properties are gradually approached by repeatedly modifying the 3D computer model of the shell including the cavity and the arrangement of the components therein, computing the resulting acoustic properties and comparing these with the desired acoustic properties specified as design target for the transducer module.

In a further exemplary embodiment of the manufacturing method the shape and/or the volume of the front and/or the back chamber is modified as part of the step of modifying.

Since the acoustic properties of the transducer module are largely dependent on the shape and volume of the front and back chambers, focusing modifications on these quantities will have the largest impact on the acoustic properties, and thus will result in a rapid convergence of the 3D computer model of the shell including the cavity and the arrangement of the components therein towards a design of the transducer module which exhibits the desired acoustic properties.

In a further exemplary embodiment of the manufacturing method the computed acoustic properties include one or more of an acoustic impedance, an acoustic compliance, a frequency response, a resonant frequency, a power conversion efficiency, an output sound pressure level. Based on these acoustic properties the acoustic performance of the transducer module can be determined for a situation where the user is wearing the transducer module at least partly within the ear canal as intended during its use.

In a further exemplary embodiment the manufacturing method further comprises the step of forming the shell according to the three-dimensional computer model by a rapid prototyping process such as for instance selective laser sintering, stereolithography, photopolymerisation, fused deposition modelling or 3D printing. This allows a very cost effective and quick production of customised shells for the transducer module, and even makes it possible to integrally form components such as for instance the membrane of the electro-acoustic transducer as part of the shell, as indicated above, thus further simplifying production since separate assembly of the acoustic assembly is not required.

In a further exemplary embodiment the manufacturing method further comprises the step of providing the computed acoustic properties of the electro-acoustic or acousto-electric transducer including the front and back chambers to a means for fitting a hearing device to the individual hearing requirements of the user.

In this way the acoustic properties of the transducer module resulting from the shell modelling can be back-annotated to the fitting means, for instance a fitting software, so that the adjustment of the hearing device parameters can be optimised based on the actually implemented transducer including designed the front and back chambers. Furthermore, if it is found during the fitting process that the desired hearing performance cannot be achieved with the transducer module as presently designed modified desired acoustic properties can be provided to the above proposed manufacturing method in order to design modified transducer module which is better suited to achieve the desired hearing performance.

Moreover, if a receiver is deployed with a casing forming a back chamber the cavity within which the receiver is arranged acts as a back chamber extension which enlarges the back volume of the receiver, i.e. the volume of the back chamber.

For such a situation, the present invention further provides a further method for manufacturing a transducer module for being worn at least partly within an ear canal of a user of the transducer module, the transducer module comprising a shell, with a cavity having an opening, and an electro-acoustic or acousto-electric transducer housed in a casing disposed within the cavity and having a sound port, which is in acoustic communication with the exterior of the shell via the opening, and a back volume extension opening, which is in acoustic communication with the cavity, the method comprising the steps of:

providing data defining geometrical constraints regarding size and shape of the shell;

generating a three-dimensional computer model of the shell taking into account the provided data, such that the shell has an outer surface which fulfils the geometrical constraints regarding size and shape of the shell given by the provided data, and of the arrangement of the casing within the cavity, the unoccupied part of the cavity being a back chamber extension for the electro-acoustic or acousto-electric transducer; and computing acoustic properties of the electro-acoustic or acousto-electric transducer including the back chamber extension based on the generated three-dimensional computer model.

In an exemplary embodiment the further manufacturing method further comprises the step of measuring the inner shape of at least a section of the ear canal of the user, wherein the data defining geometrical constraints regarding size and shape of the shell is based on the measured inner shape of the section of the ear canal of the user, and the shell thus being individually shaped for the user.

In a further exemplary embodiment the further manufacturing method further comprises the step of modifying the three-dimensional computer model of the shell by modifying the shape and/or the volume of the back chamber extension if the computed acoustic properties deviate from desired acoustic properties.

In a further exemplary embodiment of the further manufacturing method the steps of modifying and computing are repeated until the computed acoustic properties match the desired acoustic properties.

In a further exemplary embodiment of the further manufacturing method the computed acoustic properties include one or more of an acoustic impedance, an acoustic compliance, a frequency response, a resonant frequency, a power conversion efficiency, an output sound pressure level.

In a further exemplary embodiment the further manufacturing method further comprises the step of forming the shell according to the three-dimensional computer model by a rapid prototyping process such as for instance selective laser sintering, stereolithography, photopolymerisation, fused deposition modelling or 3D printing.

In a further exemplary embodiment the further manufacturing method further comprises the step of providing the computed acoustic properties of the electro-acoustic or acousto-electric transducer including the back chamber extension (27) to a means for fitting a hearing device to the individual hearing requirements of the user.

In order to take further advantage of the customisation possibilities of the proposed transducer module as well as of the proposed methods of manufacturing a transducer module an appropriate method for fitting a hearing device comprising the proposed transducer module is beneficial.

The present invention thus further provides a method for fitting a hearing device comprising the proposed transducer module to individual hearing requirements of a user of the hearing device, the method comprising the step of applying acoustic properties of the electro-acoustic or acousto-electric transducer including front and back chambers, or alternatively the back volume extension, computed according to the one of the proposed methods of manufacturing a transducer module.

As described above the acoustic properties of the transducer module resulting from the shell modelling are back-annotated for instance to a fitting software so that the adjustment of the hearing device parameters can be optimised based on the actually implemented transducer including designed the front and back chambers. By employing the acoustic properties of the transducer including front and back chambers, or alternatively the back volume extension, computed according to one of the proposed methods of manufacturing for determining the hearing device settings the hearing device can be more accurately adjusted to achieve the desired hearing performance.

It is expressly pointed out that any combination of the above-mentioned embodiments, or combinations of combinations, is subject of a further combination. Only those combinations are excluded that would result in a contradiction.

BRIEF DESCRIPTION OF THE DRAWINGS

Subsequently, the present invention is further explained with the help of exemplary embodiments and with reference to the following accompanying drawings:

FIG. 5a is a schematic side-sectional representation of a conventional in-the-ear (ITE) hearing device;

FIG. 5b is a schematic side-sectional representation of an ITE hearing device according to the present invention;

FIG. 6a is a schematic side-sectional representation of a further conventional ITE hearing device;

FIG. 6b is a schematic side-sectional representation of a further ITE hearing device according to the present invention;

DETAILED DESCRIPTION OF THE INVENTION

Figure 1:
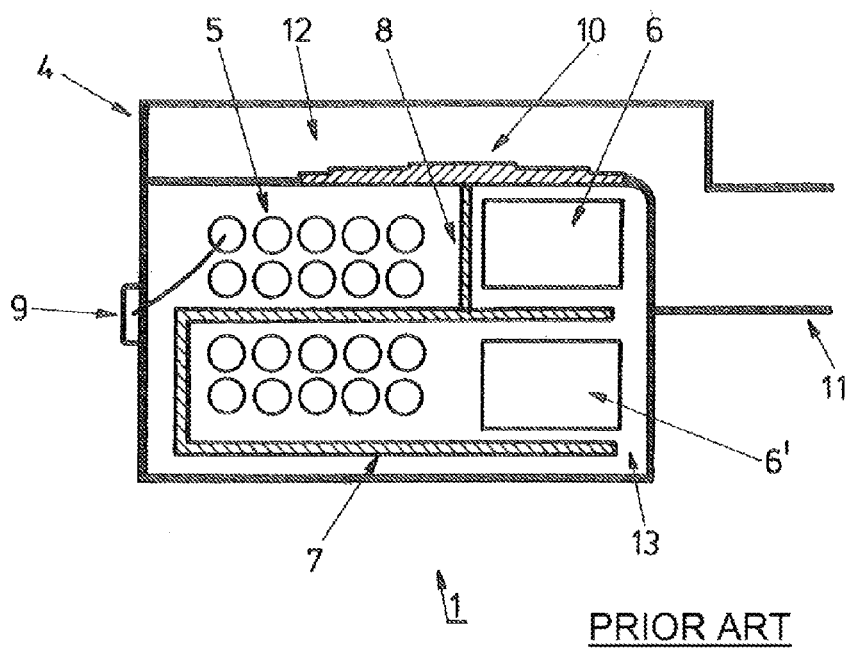
FIG. 1 is a schematic side-sectional view of a known (i.e. prior art) receiver.

FIG. 1 shows a schematic side-sectional view of a commonly employed balanced-armature type of magnetic receiver 1. This type of receiver 1 is capable of a very efficient conversion of electrical energy into sound energy. The known receiver 1 in FIG. 1 basically consists of a motor assembly 2 and an acoustic assembly 3 (together referred to as an electro-acoustic transducer) which are disposed in a casing 4. The motor assembly 2 comprises a coil 5 and a pair of permanent magnets 6, 6' through and between which a U-shaped armature 7 extends. An electric current passing through the coil 5 introduces a magneto motive force in the armature 7. As a result, the tip of the armature 7 is attracted more by one of the permanent magnets 6, 6' and less by the other, depending on the direction of the electric current, which bends the armature 7. A drive pin 8 connected to the armature 7 and to a membrane 9 (also referred to as a diaphragm) of the acoustic assembly 3, is thus moved dependent on the electrical signal applied to the coil 5 through a terminal 9 causing the membrane 10 to vibrate and generate sound waves, which exit the casing 4 via a spout 11. The acoustic properties of the receiver 1 are dependent on the air volumes in front of and behind the membrane 11 (referred to as front and back volumes), i.e. in the front chamber 12 and back chamber 13, where the motor assembly 2 is located in the back chamber 13. Typically a rectangular cuboid casing 4 is used to encapsulate the motor and acoustic assemblies 2, 3 as well as the front and back volumes.

Figure 2A:
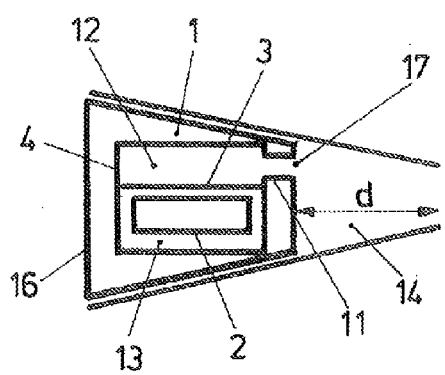
FIG. 2a is a schematic side-sectional representation of a known (i.e. prior art) receiver arranged within a shell inserted in an ear canal at a large distance d from the ear drum.
Figure 2B:
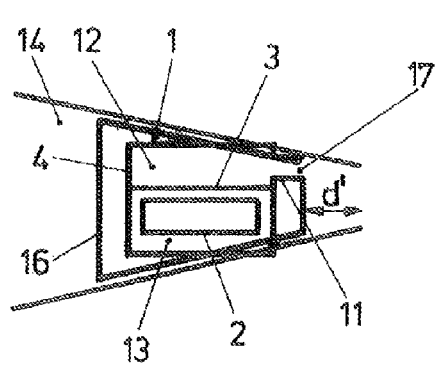
FIG. 2b is a schematic side-sectional representation of a known (i.e. prior art) receiver arranged within a shell inserted in an ear canal at a short distance d' from the ear drum.

FIG. 2 a) depicts a standard receiver 1 arranged within a shell 16 which is inserted into the outer end of an ear canal 14 such that the inner end of the shell 16 is located at a relatively large distance d from the ear drum. As schematically shown in FIG. 2 b) the rectangular casing of a standard receiver 1 often does not fit into a deeply located inner section of the ear canal 14, i.e. at a relatively short distance d' from the ear drum, and hence cannot be arranged in the shell 16 of a hearing device to be inserted into the ear canal 14 at such a location. This is evident from the casing 4 extending beyond the contour of the shell 16 and beyond the wall of the ear canal 14 in FIG. 2 b).

Figure 3:
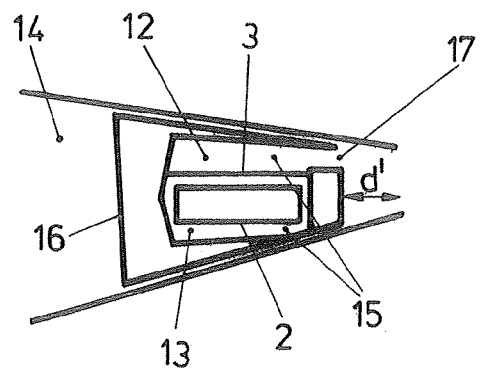
FIG. 3 is a schematic side-sectional representation of a transducer module, specifically a receiver module according to the present invention positioned within an ear canal.

In order to overcome this problem the present invention proposed to dispose the electro-acoustic transducer comprising the motor assembly 2 and the acoustic assembly 3 directly into a cavity 15 of the shell 16 without the casing 4. A receiver module according to the present invention is schematically illustrated in FIG. 3. Here the cavity 15 is formed in such a way in the shell 16, intended to be worn within a deeply located inner section of the ear canal 14, that the motor assembly 2 and the acoustic assembly 3 can be arranged closer to the opening 17, which constitutes a sound port to the exterior of the shell 16. The front and back volume of the receiver module has been maintained equivalent to that of the solution using a standard receiver 1 with a casing 4, but the shape and volume of the cavity 15 and the arrangement of the acoustic membrane 10 has be adapted such that the front chamber 12 and the back chamber 13 provide the necessary free space for the front and back volumes of air.

The front chamber 12 is in acoustic communication with the exterior of the shell 16 via the opening 17, also referred to as sound port, whilst the back chamber 13 is substantially sealed from the environment and the front chamber 12. However, a means for allowing atmospheric pressure equalisation within the back chamber 13, such for instance a perforation in the membrane 10 or a vent with a very small diameter connecting the back chamber 13 with the exterior of the shell 16, is provided.

As already indicated earlier, a small receiver module is often desired in order to be able to insert the receiver module deeply into the bony portion of the ear canal 14, where it is seated in a sealing manner. This is referred to as a closed "deep-fitting", which offers a reduced occlusion effect in comparison to a less deep fitting located within the cartilaginous region of the ear canal 14. Alternatively, it is sometimes desirable to be able to arrange the receiver module in the form of an "open-fitting" within an outer section of the ear canal 14, whereby the receiver needs to be small in order not to occlude the ear canal 14 and leave its cross-section as open as possible. Moreover, dealing with profound hearing losses requiring a high power hearing device utilising a bulky receiver necessitates a closed-fitting in an outer section of the ear canal. In all three cases a receiver module according to the invention will be of use due to its reduced size relative to one incorporating a standard receiver 1 with a casing 4.

To be able to mount the electro-acoustic transducer within the cavity 15 of the shell 16, the shell 16 is for instance made of two parts. The first and second part of the two-part shell can be formed as two separate parts or as a single part which is subsequently cut into two parts. Once the electro-acoustic transducer has been arranged within the cavity 15 the two parts of the shell can be firmly joined together. This can for instance be achieved by gluing or welding the two parts together, or especially in the case where the first and second part of the two-part shell were formed as two separate parts this can be achieved by separably connecting the two parts to one another, for instance by means of quick-connect closures, such as catch pawls, detents or bayonet-type junctions.

The motor assembly 2 and the acoustic assembly 3 are resiliently attached to the shell 16 within the cavity 15 in order to minimise the transfer of acoustic vibrations from the electro-acoustic transducer to the shell 16 and on the other hand to protect the electro-acoustic transducer from shock impacts imposed on the receiver module from the outside. Hereby, the motor assembly 2 and the acoustic assembly 3 are attached to the shell 16 via elastic braces or brackets.

The membrane 10 is for instance mounted at its periphery to a rigid frame. This provides a stable structure for attaching the acoustic assembly 3 to the shell 16. The frame can for instance be positioned between the first and second part of the shell 16 and the profile of their openings can be used as supports for the frame, thus allowing to position the membrane 10 quickly and accurately during assembly. In this case the first part of the shell 16 includes the front chamber 12 and the second part of the shell 16 includes the back chamber 13. In applications where the shell 16 also contains an ambient microphone mechanical feedback between the two can occur. In order to minimise the propagation of vibrations from the membrane 10 of the acoustic assembly to the membrane of the ambient microphone, the microphone should be positioned such that vibrations generated by the membrane 10 of the acoustic assembly do not influence the ambient microphone output signal, e.g. by arranging the membrane of the ambient microphone parallel to the direction of the vibrations. Preferably, the plane of the membrane 10 of the electro-acoustic transducer and the plane of the membrane of the ambient microphone are to be oriented perpendicularly to each other.

To provide magnetic shielding of the electro-acoustic transducer the entire surface of the cavity 15 is lined with a material having a very high magnetic permeability, such as mu-metal.

For certain applications further functional units, such as for instance one or more microphone modules, an amplifier, a processing unit, a wireless transceiver, an antenna, a power supply, are arranged within the shell 16, either in a separate cavity or within the back chamber 13.

Figure 4:
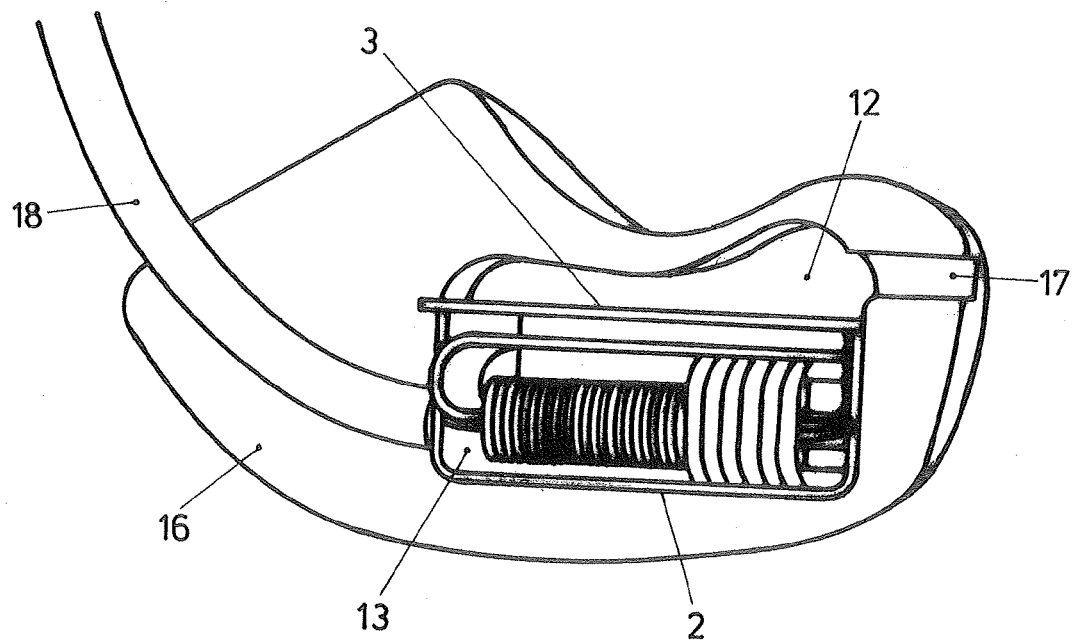
FIG. 4 is a sectional view of an exemplary embodiment of a receiver module according to the present invention for use within a user's ear canal in connection with a BTE component (not shown)

As exemplified in FIG. 4 the receiver module according to the present invention can be used in conjunction with a hybrid-type hearing device, comprising a component (not shown) worn outside of the ear canal, such as for instance a behind-the-ear (BTE) component having a housing shaped to fit behind the ear of the user, and the receiver module worn at least partly within the ear canal (receiver-in-canal, RIC), where the two are connected to one another via a flexible connecting means 18, for example a thin tube including wires to provide an electrical signal from the BTE component to the receiver module, i.e. from an amplifier means (not shown) to the motor assembly 2.

FIG. 5 *a*) shows a conventional in-the-ear (ITE) type hearing device (or receiver-in-canal (RIC) type hearing device module) in a schematic side-sectional representation. This ITE hearing device comprises a shell 16 and a faceplate 19 arranged at a distal opening in the shell 16. The components to be housed within the shell 16 are conventionally mounted through the distal opening. A receiver 1 is arranged close to a proximal opening in the shell 16, whereby the proximal opening is covered at least partly by a wax protection element 20 (also referred to as a wax guard) to prevent the receiver 1 from being clogged with ear wax or other dirt. The entire remaining interior space within the shell 16 is used to house further components. For a RIC type hearing device module the receiver 1 is connected with the BTE component via the connecting means 18 comprising wires. In FIG. 5 *b*) an ITE hearing device (or RIC type hearing device module) according to the present invention is schematically illustrated. Here a divider wall 22, which subdivides the interior space of the shell 16 into two cavities 15, 15', is integrally formed with the shell 16. If the receiver 1 is deployed with a casing forming a back chamber 13 the cavity 15 within which the receiver 1 is arranged acts as a back chamber extension 27 which enlarges the back volume of the receiver 1, i.e. the volume of the back chamber 13. If the receiver 1 is deployed without a casing the part of the cavity 15 behind the membrane 10 on the side opposite to the proximal opening acts as the back chamber 13. Enlarging the back volume for instance increases the low frequency output or alternatively, when maintaining the same low frequency output, reduces the receiver current consumption. Since the divider wall 22 is integrally formed with the shell 16 during the shell manufacturing process employing an additive build-up procedure, the receiver 1 must be mounted through the proximal opening in the shell 16. This assembly of receiver is greatly simplified if the receiver 1 is preassembled onto a tip-plate 21 together with the wax protection element 20.

FIG. 6 *a*) depicts a further conventional ITE hearing device (or RIC type hearing device module) where the receiver 1 is connected to the proximal opening in the shell 16 by means of an acoustic tube 23. The acoustic tube 23 also suspends the receiver 1 within the hearing device thus allowing flexible positioning of the receiver 1 within the shell 16 whilst being mounted from the distal end of the hearing device. FIG. 6 *b*) illustrates a further ITE hearing device (or RIC type hearing device module) according to the present invention. Here the receiver 1 is also intended to be mounted from the distal end of the hearing device. In order to do so the divider wall 22 cannot be in place until the receiver 1 is arranged at the proximal opening in the hearing device. Once this is the case the divider wall for instance in the form of a cap 24 is affixed to the shell 16 by gluing or welding onto a mechanical stop, such as a shoulder 25 formed in the shell 16, thus sealing the two cavities 15, 15' from one another. Sealing the cavity 15 acting as back chamber extension 27 or as back chamber 13 off from the other cavity 15' may be necessary if user control elements and the battery door disposed on the face-plate 19 are not perfectly sealed, which is frequently the case, and would therefore decrease receiver performance (due to acoustic short circuits) and also increase the tendency of feedback through the ambient microphone also disposed on the face-plate 19. For a RIC type hearing device module connected to a BTE component the connecting means 18 either traverses the cap 24 or alternatively the connecting means 18' traverses the shoulder 25 and/or the shell 16.

As stated in the summary of the invention above the present invention not only applies to a receiver module but likewise to a microphone module such as for instance employed as an ear canal microphone. An enlarged back chamber of the microphone yields greater microphone sensitivity—alternatively, smaller microphones can be realised whilst maintaining the same sensitivity as with previous standard microphones. Furthermore, transducer modules are conceivable which comprise both a receiver and a microphone. Hereby, the microphone can for instance be arranged within the receiver, e.g. within the back chamber of the receiver. However, when the microphone is within the receiver back chamber the microphone must of course be sealed and this seal must be stiff enough to avoid that sound emitted by the receiver feeds back into the microphone through volume deformation of the microphone.

Figure 7A:
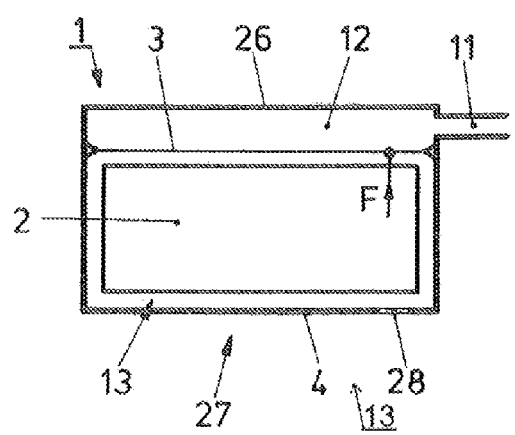
FIG. 7a is a schematic side-sectional representation of a transducer with the motor assembly in the back chamber.
Figure 7B:
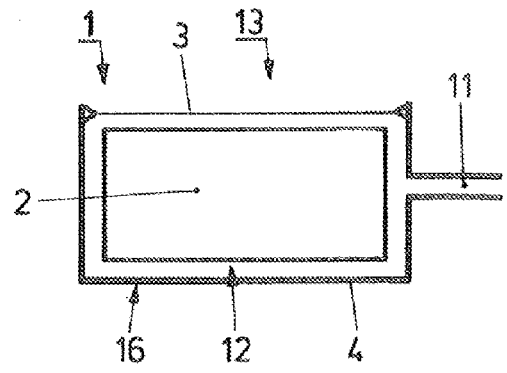
FIG. 7b is a schematic side-sectional representation of a further transducer with the motor assembly in the front chamber.

Traditionally the motor assembly 2 of the receiver 1 is located in the back chamber 13 as shown in FIG. 7 *a*) and the front chamber 12 is kept as small as possible. It is however also possible to put the motor assembly 2 into the front chamber 12 as illustrated in FIG. 7 *b*), such that the sealing lid 26 over the acoustic assembly 3 can be omitted. This allows to get rid of the volume of the lid 26. An increase of the volume of the front chamber 12 should thereby be avoided in order not to degrade transducer performance.

Combining microphone and receiver front or back chambers through an adaptation network allows to cancel receiver sound in the microphone (in order not to overload). With multi-diaphragm receivers and microphones it is also possible to combine front and back chambers of the partial-receivers/microphones either directly or through an acoustic adaptation network in order to adapt to a certain desired geometry and acoustical performance. The back/front volume combinations highly depend on the physical configurations (dimensions, material, etc.) of the receiver and microphone components.

Furthermore, the acoustic output impedance and the frequency response of the receiver can be further adapted to specific needs with the help of an acoustical network in the extended back volume 27, e.g. connected to the back chamber 13 via an opening 28.

In addition to or instead of a relatively large (i.e. acoustically transparent) opening 28 connecting the back chamber 13 with an extended back volume 27 as shown in FIG. 7 *a*), one or more micro-bores (not shown) may be provided in a wall of the back chamber 13 acting as tiny pressure vents to ensure barometric pressure equalisation/compensation, such that the pressure within the entire shell 16 is essentially equal and corresponds to the ambient air pressure. Such a micro-bore acoustically represents a low pass with a typical cut-off frequency in the range of 1 to 10 Hz, and therefore has no influence on the dynamic behaviour of the receiver 1. This kind of pressure equalisation/compensation can for instance be achieved by means of multiple tiny perforations, e.g. having a diameter in the range of 0.01 to 0.05 mm, or short (e.g. with a length of approximately 0.2 mm) and very thin (e.g. with a diameter of approximately 0.03 mm) micro-venting channels.

In order to be able to design receiver modules which take into account the specific shape of the user's ear canal and for example also the specific acoustic requirements of the user a manufacturing method needs to be available which allows custom design and manufacturing of individual receiver modules. According to the invention such a manufacturing method for instance comprises the steps indicated in the following.

In a first step the inner shape and size of the user's ear canal 14 is measured. This can be achieved by taking an imprint of the user's ear canal 14 and then scanning the imprint with a 3D object scanner, or alternatively by directly scanning the ear canal 14 of the user with the help of an appropriate probe. In either case a 3D computer model of the user's ear canal 14 or part thereof is generated.

In a second step performed with the aid of an appropriate shell modelling software, the shell 16 is designed based on the type of receiver module required by the user, whereby the shell design software uses the 3D computer model of user's ear canal 14 to individually shape the outer surface of the shell 16, as well as 3D computer models of the components, such as the motor assembly 2 and the acoustic assembly 3, to form the cavity 15 within the shell 16 and arrange the components therein. When forming the cavity 15 and arranging the acoustic assembly 3 therein, special attention is given to achieving appropriately sized front and back chambers 12 & 13, respectively, having a sufficiently large front and back volumes, respectively, for the air to generate sound waves. The result of this design is a 3D computer model of the shell 16 including the cavity 15 with the front and back chambers 12 & 13 as well as the arrangement of all components within the shell 16, i.e. a 3D computer model of the complete receiver module.

In a third step, acoustic properties of the receiver module are computed using an acoustic analysis software based on geometric data extracted from the 3D computer model of the complete receiver module. The acoustic properties determined in this step are then compared with desired target acoustic properties. If these target acoustic properties are achievable with the present design according the 3D computer model of the complete receiver module, the design is ready to be produced, otherwise the design is modified in a fourth step.

In a fourth step a design resulting from the second step which is acoustically insufficient, i.e. does not match the target acoustic properties, is modified by making changes to any of the shell shape and size, the positioning within the shell 16 and shape and size of the cavity 15, and the arrangement of the components within the cavity 15, yielding a modified 3D computer model of the complete receiver module.

Subsequently, the acoustic properties of the modified receiver module are determined according to the third step. The cycle of modifying the design according to the fourth step and determining the acoustic properties of the thus modified receiver module according to the third step is repeated until the determined acoustic properties match the desired target acoustic properties, at which point the design is ready to be produced.

Finally, the shell 16 of the receiver module is formed employing an additive manufacturing process, such as for instance selective laser sintering (SLS), fused deposition modelling (FDM), digital light projection (DLP), stereo-lithography (SL) or 3D printing, whereby the shell is created by laying down successive layers of material. 3D printers for example allow to print parts and assemblies made of several materials with different mechanical and physical properties in a single build process. Such a production process also allows to integrally form the membrane 10 of the electro-acoustic transducer together with the shell 16 in a single production step, thus saving the step of having to assemble the two and furthermore providing an extra degree of freedom to customise the receiver module to the requirements of the user by being able to optimise the membrane in terms of its physical dimension, its deployment within the cavity and its acoustic properties.

A similar manufacturing method may be applied to provide a receiver module tailored to a hearing device model having specific requirements in terms of shape and/or size and/or acoustic properties, which is suitable to fulfil the needs of a large number of users, i.e. which is not fully customised according to the individual needs of a single person. To obtain such "one-size-fits-all" types of BTE, ITE and/or RITE hearing devices, their specific requirements are provided as inputs in the previously described manufacturing method instead of the individual data related to a certain user.

In both the case of an individualised hearing device and of a hearing device model having one or more of the above listed specific requirements the shell 16 of the receiver module may be implemented as a separate part of the housing of the hearing device or as an integral part of the housing of the hearing device.

What is claimed is:

1. A hearing device with a housing and a transducer module, the transducer module comprising a shell (16) with a cavity (15) having an opening (17), wherein at least part of the shell (16) forms part of the housing, and wherein an electro-acoustic or acousto-electric transducer, comprising a motor assembly (2) and an acoustic assembly (3) including a membrane (10), is arranged within the cavity (15), the acoustic assembly (3) being disposed within the shell (16) such that the cavity (15) is divided into a front chamber (12) and a back chamber (13), the motor assembly (2) being disposed within the back chamber (13) or the front chamber (12) and being operatively coupled to the membrane (10), and the front chamber (12) being in acoustic communication with the exterior of the shell (16) via the opening (17), wherein the shell (16) has an outer surface individually shaped according to a measured inner shape of a section of an ear canal (14) of a user of the hearing device, and wherein the shell (16) comprises a divider wall (22) which subdivides an interior space of the shell (16) into the cavity (15) and a further cavity (15'), said divider wall (22) sealing the cavity (15) from the further cavity (15'), and said divider wall (22) is formed separately from the shell (16) and affixed to the shell (16), wherein a position of the acoustic assembly (3) and/or a position of the divider wall (22) is configured to be customized according to desired acoustic properties of the user, and wherein the position of the acoustic assembly (3) and/or the position of the divider wall (22) define a shape and/or a volume of the front chamber (12) and the back chamber (13).

2. The hearing device according to claim 1, wherein the motor assembly (2) and the acoustic assembly (3) are attached to the shell (16) via elastic braces or brackets.

3. The hearing device according to claim 1, wherein the acoustic assembly (3) further comprises a rigid frame to which the membrane (10) is mounted at its periphery.

4. The hearing device according to claim 1, wherein the transducer module further comprises one or more of the following functional units:
   a microphone module,
   an amplifier,
   a processing unit,
   a wireless transceiver,
   an antenna,
   a t-coil,
   a power supply,
wherein at least one of the one or more functional units is disposed within the back chamber (13).

5. The hearing device according to claim 1, wherein the shell (16) is a two-part shell with a first part and a second part.

6. The hearing device according to claim 5, wherein the first part includes the front chamber (12) and the second part includes the back chamber (13).

7. The hearing device according to claim 5, wherein the acoustic assembly (3) is mounted between the first part and the second part.

8. The hearing device according to claim 1, further comprising a behind-the-ear component shaped to fit behind an ear of the user, the behind-the-ear component comprising at least one microphone and an amplifier means, wherein the transducer module is separate from the behind-the-ear component, and wherein the amplifier means is operatively connected to the motor assembly (2).

9. The hearing device according to claim 1, wherein one or more micro-bores are provided in a wall of the back chamber 13 for barometric pressure equalisation, said one or more micro-bores preferably having a low pass characteristic with a cut-off frequency below 10 Hz.

10. A method for manufacturing a transducer module for being worn at least partly within an ear canal (14) of a user of the transducer module, the transducer module comprising a shell (16), with a cavity (15) having an opening (17), and an electro-acoustic or acousto-electric transducer, disposed within the cavity (15) and including a motor assembly (2) and an acoustic assembly (3), the method comprising the steps of:
   providing data defining geometrical constraints regarding size and shape of the shell (16);
   generating a three-dimensional computer model of the shell (16) taking into account the provided data, such that the shell (16) has an outer surface which fulfils the geometrical constraints regarding size and shape of the shell (16) given by the provided data, and of the arrangement of the motor assembly (2) and the acoustic assembly (3) within the cavity (15), such that the acoustic assembly (3) divides the cavity (15) into a front chamber (12) and a back chamber (13) having a desired front volume and back volume, respectively, whereby the motor assembly (2) is disposed within the back chamber (13) or the front chamber (12) and is operatively coupled to the acoustic assembly (3), and the front chamber (12) is in acoustic communication with the exterior of the shell (16) via the opening (17);
   computing acoustic properties of the electro-acoustic or acousto-electric transducer including respective volumes of the front and back chambers (12, 13) using an acoustic analysis software based on geometric data extracted from the generated three-dimensional computer model; and
   modifying the three-dimensional computer model of the shell (16) and/or of the arrangement of the motor assembly (2) and/or the acoustic assembly (3) within the cavity (15) if the computed acoustic properties deviate from desired acoustic properties,
wherein as part of the step of modifying, the shape and/or the volume of the front and/or the back chamber (12, 13) is modified by varying a position of the acoustic assembly (3) and/or a position of a divider wall (22), which subdivides an interior space of the shell (16) into the cavity (15) and a further cavity (15').

11. A method for manufacturing a transducer module for being worn at least partly within an ear canal (14) of a user of the transducer module, the transducer module comprising a shell (16), with a cavity (15) having an opening (17), and an electro-acoustic or acousto-electric transducer housed in a casing (4) disposed within the cavity (15) and having a sound port, which is in acoustic communication with the exterior of the shell (16) via the opening (17), and a back volume extension opening (28), which is in acoustic communication with the cavity (15), the method comprising the steps of:

providing data defining geometrical constraints regarding size and shape of the shell (16);

generating a three-dimensional computer model of the shell (16) taking into account the provided data, such that the shell (16) has an outer surface which fulfils the geometrical constraints regarding size and shape of the shell (16) given by the provided data, and of the arrangement of the casing (4) within the cavity (15), the unoccupied part of the cavity (15) being a back chamber extension (27) for the electro-acoustic or acousto-electric transducer;

computing acoustic properties of the electro-acoustic or acousto-electric transducer including the back chamber extension (27) using an acoustic analysis software based on geometric data extracted from the generated three-dimensional computer model; and modifying the three-dimensional computer model of the shell (16) by modifying the shape and/or the volume of the back chamber extension (27) if the computed acoustic properties deviate from desired acoustic properties, wherein as part of the step of modifying, the shape and/or the volume of the back chamber extension (27) are modified by varying a position of a divider wall (22), which subdivides an interior space of the shell (16) into the cavity (15) and a further cavity (15).

12. The method according to claim 10, further comprising the step of:

measuring the inner shape of at least a section of the ear canal (14) of the user, wherein the data defining geometrical constraints regarding size and shape of the shell (16) is based on the measured inner shape of the section of the ear canal (14) of the user, and the shell (16) thus being individually shaped for the user.

13. The method according to claim 10, wherein the steps of modifying and computing are repeated until the computed acoustic properties match the desired acoustic properties.

14. The method according to claim 10, wherein the computed acoustic properties include one or more of an acoustic impedance, an acoustic compliance, a frequency response, a resonant frequency, a power conversion efficiency, an output sound pressure level.

15. The method according to claim 10, further comprising the step of forming the shell (16) according to the three-dimensional computer model by a rapid prototyping process such as for instance selective laser sintering, stereolithography, photopolymerisation, fused deposition modelling or 3D printing.

16. The method according to claim 10, further comprising the step of providing the computed acoustic properties of the electro-acoustic or acousto-electric transducer including the front and back chambers (12, 13) to a means for fitting a hearing device to the individual hearing requirements of the user.

17. The method according to claim 11, further comprising the step of providing the computed acoustic properties of the electro-acoustic or acousto-electric transducer including the back chamber extension (27) to a means for fitting a hearing device to the individual hearing requirements of the user.

18. A method for fitting a hearing device according to claim 1 to individual hearing requirements of a user of the hearing device, the method comprising the step of applying acoustic properties of the electro-acoustic or acousto-electric transducer including front and back chambers (12, 13) computed according to the method of one of the claims 10, 12, 13, 14, 15 and 16.

19. A method for fitting a hearing device comprising a transducer module for being worn at least partly within an ear canal (14) of a user of the transducer module, the transducer module comprising a shell (16), with a cavity (15) having an opening (17), and an electro-acoustic or acousto-electric transducer housed in a casing (4) disposed within the cavity (15) and having a sound port, which is in acoustic communication with the exterior of the shell (16) via the opening (17), and a back volume extension opening (28), which is in acoustic communication with the cavity (15), the unoccupied part of the cavity (15) being a back chamber extension (27) for the electro-acoustic or acousto-electric transducer, to individual hearing requirements of a user of the hearing device, the method comprising the step of applying acoustic properties of the electro-acoustic or acousto-electric transducer including the back volume extension (27) computed according to the method of claim 11.

20. A hearing device comprising a transducer module for being worn at least partly within an ear canal (14) of a user of the transducer module, the transducer module comprising a shell (16) with a cavity (15) having an opening (17), and an electro-acoustic or acousto-electric transducer housed in a casing (4) disposed within the cavity (15) and having a sound port, which is in acoustic communication with the exterior of the shell (16) via the opening (17), and a back volume extension opening (28), which is in acoustic communication with the cavity (15), the unoccupied part of the cavity (15) being a back chamber extension (27) for the electro-acoustic or acousto-electric transducer, wherein the shell (16) further comprises a divider wall (22) which subdivides an interior space of the shell (16) into the cavity (15) and a further cavity (15'), said divider wall (22) sealing the cavity (15) from the further cavity (15'), and said divider wall (22) is formed separately from the shell (16) and affixed to the shell (16), wherein a position of the divider wall (22) is configured to be customized according to desired acoustic properties of the user, and wherein the position of the divider wall (22) defines a shape and/or a volume of the back chamber extension (27).

21. The method according to claim 10, wherein as part of the step of modifying, the shape and/or the volume of the back chamber (13) are modified by varying a position of a divider wall (22), which subdivides an interior space of the shell (16) into the cavity (15) and a further cavity (15').

22. The hearing device according to claim 1, further comprising an acoustic tube (23) connecting a receiver (1) to a proximal opening of the shell (16), said acoustic tube (23) allowing flexible positioning of the receiver (1) within the shell (16).

* * * * *

UNITED STATES PATENT AND TRADEMARK OFFICE
CERTIFICATE OF CORRECTION

PATENT NO. : 9,571,943 B2  Page 1 of 1
APPLICATION NO. : 13/981410
DATED : February 14, 2017
INVENTOR(S) : Roland Hug et al.

It is certified that error appears in the above-identified patent and that said Letters Patent is hereby corrected as shown below:

In the Claims

Column 19, Line 35, replace "(15)" with -- (15') --.

Signed and Sealed this
Thirteenth Day of June, 2017

Joseph Matal
*Performing the Functions and Duties of the
Under Secretary of Commerce for Intellectual Property and
Director of the United States Patent and Trademark Office*